(12) United States Patent
Lin et al.

(10) Patent No.: US 7,035,111 B1
(45) Date of Patent: Apr. 25, 2006

(54) CIRCUIT BOARD ORIENTATION WITH DIFFERENT WIDTH PORTIONS

(75) Inventors: Jun Lin, Tomball, TX (US); Tom D. Wright, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/444,330

(22) Filed: May 23, 2003

(51) Int. Cl.
*H05K 1/00* (2006.01)
*H05K 1/18* (2006.01)
*H05K 7/02* (2006.01)
*H05K 7/06* (2006.01)

(52) U.S. Cl. ............... 361/748; 361/803; 361/685; 361/686

(58) Field of Classification Search ............... 361/748, 361/801, 825, 683, 684, 728, 730, 760, 727, 361/810, 685–686, 803, 797; 439/74, 76.1; 174/138 G, 138 D
See application file for complete search history.

(56) References Cited

U.S. PATENT DOCUMENTS

| | | | | |
|---|---|---|---|---|
| 4,047,242 A | * | 9/1977 | Jakob et al. | 361/714 |
| 6,134,120 A | * | 10/2000 | Baldwin et al. | 361/804 |
| 6,185,093 B1 | * | 2/2001 | Moss | 361/684 |
| 6,241,562 B1 | * | 6/2001 | Benda et al. | 439/731 |
| 6,462,670 B1 | * | 10/2002 | Bolognia et al. | 340/815.45 |
| 6,475,016 B1 | | 11/2002 | Heindenreich et al. | |
| 6,481,809 B1 | | 11/2002 | Richardson | |
| 6,482,046 B1 | | 11/2002 | Salinas | |
| 6,498,731 B1 | * | 12/2002 | Roscoe et al. | 361/796 |
| 6,507,496 B1 | * | 1/2003 | Levy et al. | 361/760 |
| 6,528,904 B1 | | 3/2003 | Wong | |

* cited by examiner

*Primary Examiner*—Kamand Cuneo
*Assistant Examiner*—Hung S. Bui

(57) ABSTRACT

A circuit board contained in a circuit board holder forms a server blade that fits into a bay of a server blade enclosure. The circuit board permits standard electrical components to fit within the cross-sectional width of the server blade. The server blade in cross section may be generally triangular, L-shaped or another type of polygon that permits placement of tall components that otherwise would not fit in a generally rectangular server blade.

24 Claims, 3 Drawing Sheets

CIRCUIT BOARD ORIENTATION WITH DIFFERENT WIDTH PORTIONS

BACKGROUND

Modern computers usually contain circuit boards, such as printed circuit boards (PCBs) on which a number of processors and accompanying peripheral components are mounted. A blade system includes an enclosure, with the enclosure containing a number of bays and each bay is capable of holding a printed circuit board that may be a blade. For example, some enclosures are capable of holding 20 blades. A rack that may be a server rack may contain a number of enclosures, with each enclosure containing a number of blades.

One type of server that employs an architecture similar to the one described above is an enclosure that includes server blades. A server blade includes a holder for holding a printed circuit board that has a generally rectangular dimension capable of fitting into a bay of a server blade enclosure. A server blade generally has a relatively thin width w that gives the server blade a razor-blade like appearance.

Each server blade includes a processor or processors and a number of components such as memory modules, disk drives, network interface controllers (NICs), heat sinks, and so forth. These components are placed on the PCB of the server blade in such a way so that they fit within the width of the server blade. Because of the narrow width of the server blade, many standard components that may be available from component suppliers may not be used. Also, due to the narrow width, the density of components (e.g., memory devices) or size of components (e.g., heat sinks) may have to be reduced.

DETAILED DESCRIPTION

In the following description, numerous specific details are set forth to provide a detailed understanding of the present invention. However, one skilled in the art will readily appreciate that the present invention may be practiced without these specific details.

Figure 1:
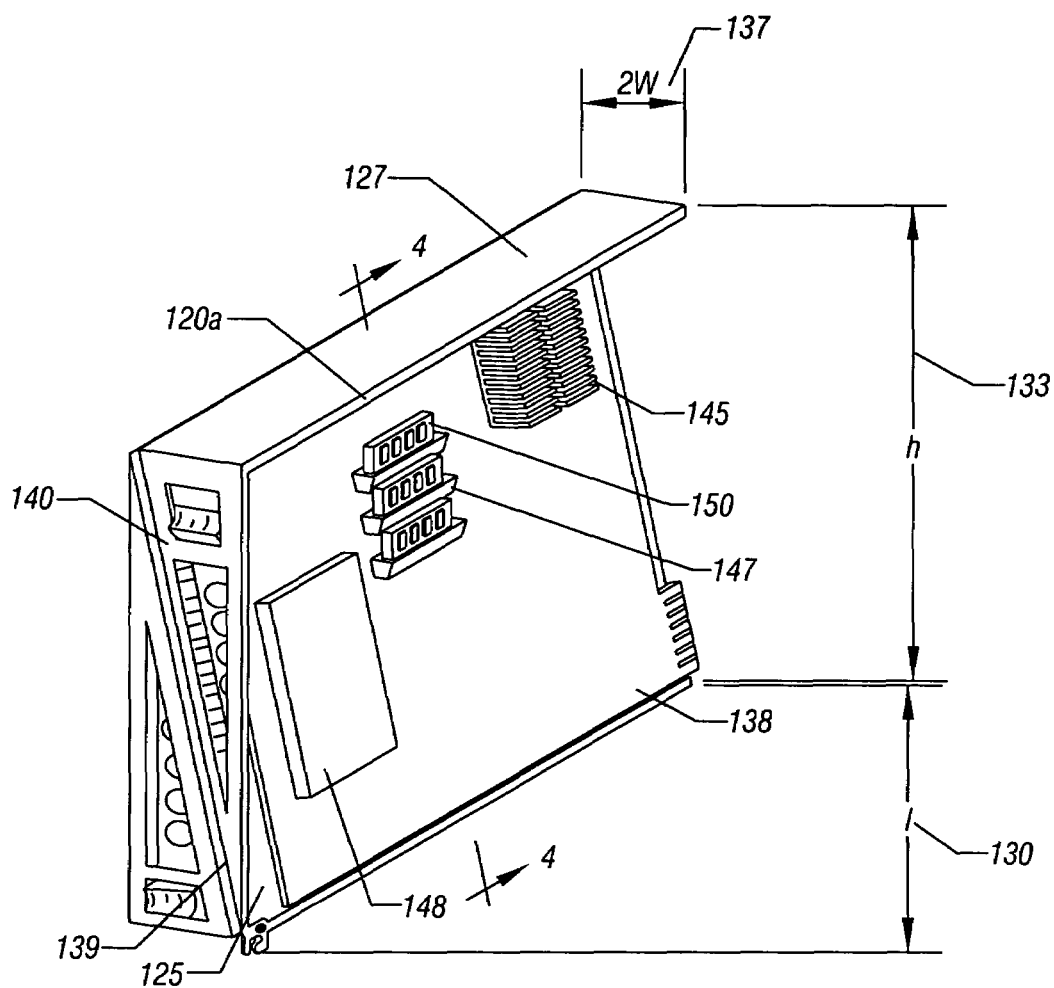
FIG. 1 shows a server blade in accordance with some embodiments of the present invention.

Referring to FIG. 1, a server blade 120a has a holder 140 to hold a PCB 138 on which are mounted various components, such as a processor (not shown), memory devices 150, a hard disk drive 148, heat sinks 145, input/output (I/O) peripheral components (not shown) and so forth. The holder 140 generally has a non-rectangular cross-section (unlike conventional blade server holders) to enable higher density or larger components to be mounted on the circuit board. In some embodiments, the holder 140 provides an inclined surface 125 on which the PCB 138 can be mounted.

Figure 2:
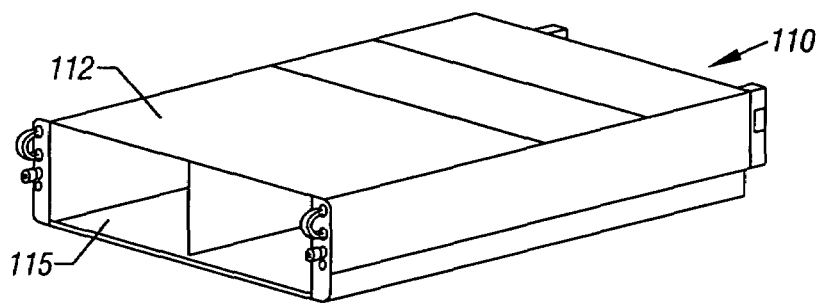
FIG. 2 shows an enclosure in accordance with some embodiments of the present invention.

Referring to FIG. 2, a server blade enclosure 110 according to one embodiment includes a computer server rack-mountable chassis 112 containing a number of server blade bays 115. In one example, the server blade enclosure 110 may contain 20 server blade bays. The server blade enclosure 110 may also include power supplies (not shown) that are redundant and can be removed while the computer server is in operation. Similarly, the server blade enclosure 110 may also include cooling fans (not shown) that are redundant and can be removed while the computer server is in operation.

Returning now to FIG. 1, the server blade 120a has a length 1130, height h 133 and width 2w 137, and includes the PCB 138 inside a PCB holder 140. The PCB holder 140 in one embodiment may be a bracket (not shown in FIG. 1) that includes a front face plate and a metal backside underneath the PCB 138. In another embodiment as shown in FIG. 1, the PCB holder 140 may be a PCB chassis that contains a front face plate, metal side supports and a metal backside (not shown) underneath the PCB 138. Thus, the PCB holder 140 can fit components with a maximum width of 2w in the broad width portion 137 proximate the upper surface 127 of the PCB holder 140. As shown in FIG. 1, server blade 120a may include a heat sink 145 of size up to 2w mounted on the PCB 138 to take advantage of the maximum 2w width of PCB holder 140. Similarly, memory sockets 147 that hold memory modules 150 may be mounted on PCB 138 as shown in FIG. 1 to take advantage of the 2w width of PCB holder 140. To allow mounting of multiple memory sockets 147 and memory modules 150 on PCB 138, the memory sockets and memory modules may be mounted at an angle of about 25° relative to PCB 138 as described below with reference to FIG. 4. PCB holder 140 may also include a narrow width portion 139 along which components of narrow width such as hard disk drive 148 may be mounted on PCB 138.

Each server blade 120a may slide in or otherwise be positioned in the server blade enclosure 110 as shown in FIG. 2 in some embodiments of the invention. The server blade enclosure 110 may also include an interconnection tray (not shown) that connects (through interconnects) the server blades to enable the server blades to communicate and transfer information with other devices. The interconnection tray in some embodiments may include an interconnect switch such as a RJ-45 patch panel or a RJ-21 patch panel.

Figure 3:
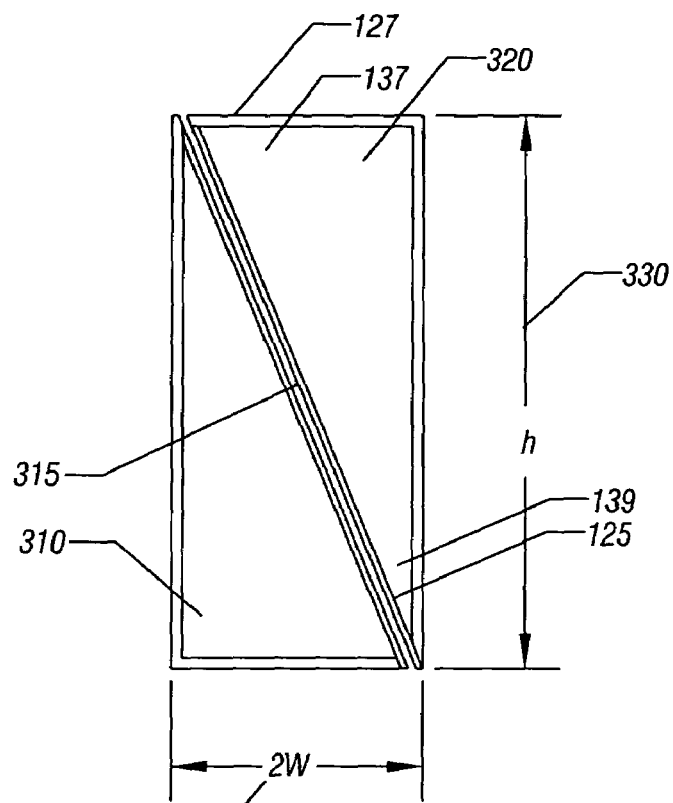
FIG. 3 is a schematic of a cross-sectional view of two server blade holders in accordance with some embodiments of the present invention.

Referring now to FIG. 3, a schematic of a cross-sectional view of two server blades including server blade holders 310 and 320 in accordance with some embodiments of the present invention is shown. The cross-section of the server blades as shown in FIG. 3 are viewed facing the front of the server blades, thus showing the generally triangular cross-sectional shape of the server blade with narrow width portion 139 and broad width portion 137. Each of the narrow width portion 139 and the broad width portion 137 provides a mounting surface on the inclined surface on which can be mounted PCB components, either directly or indirectly through a circuit board. The height h 330 and width 2w 340 of each server blade can be seen in this cross-sectional view. A cross-section of the inclined surface 125 and the top surface 127 of each server blade can also be seen in FIG. 3. The inclined surface 125 is the longest side of the general right triangle formed in the cross-section of the server blade. Because of its generally triangular cross-section, server blade 310 and 320 lean against each other along their respective inclined walls 315. The generally triangular cross-section of the server blade allows two of the generally triangular server blades to occupy the same amount of enclosure space as two generally rectangular server blades. However, each server blade has a maximum width of 2w 120a that is double the width w of the generally rectangular server blade. Thus, as described below with reference to FIGS. 4–5, components that may not have fit in the generally rectangular server blades of width w may now fit in the broader width portion 2w of the generally triangular server blades.

Figure 4:
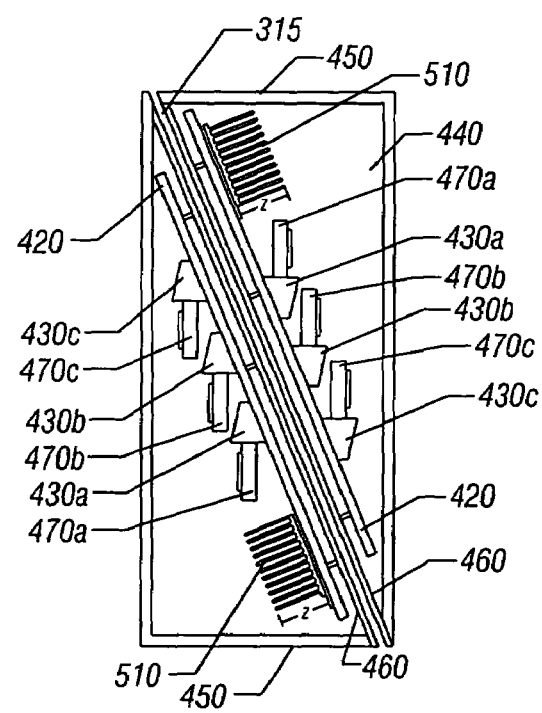
FIG. 4 is a schematic of a cross-sectional view of two server blades each able to fit multiple memory modules and a large heat sink in accordance with some embodiments of the present invention.

Turning now to FIG. 4, a cross-sectional view of the two server blades shown in FIG. 3 containing multiple memory modules and a heat sink in accordance with some embodiments of the present invention is shown. Each of the server blades contains a PCB 420 upon which are mounted memory sockets 430a, 430b and 430c. In some embodiments, a PCB holder 440 that creates the generally triangular prism shape of each server blade may be a PCB chassis that contains a front face plate (not shown), a metal side support 450 and a metal backside 460 forming the inclined surface 125 underneath the PCB 420. PCB 420 may be attached to the metal backside 460 such that the PCB 420 lies on the inclined surface 125. In some embodiments of the invention, the memory modules 470a, 470b and 470c are positioned at an angle of about 25° relative to PCB 420 allowing the memory modules to fit within the 2w width of the PCB holder 440. The memory modules 470a, 470b and 470c in some embodiments of the invention may be double-inline memory modules (DIMMs) incorporating double data rate (DDR) technology or in other embodiments single-inline memory modules (SIMMs) incorporating dynamic random access memory (DRAM) technology or static random access memory (SRAM) technology. As shown in FIG. 4, three memory sockets and memory modules may be mounted on PCB 420 in a server blade in some embodiments. However, for other embodiments a lesser or greater number of memory sockets and modules may be mounted based on the cost/performance, surface area and other aspects of the server blade.

Referring still to FIG. 4, a cross-sectional view of the two server blades shown in FIG. 3 each capable of fitting a large heat sink 510 in accordance with some embodiments of the present invention is shown. Each of the server blades contain a PCB 420 upon which is mounted heat sink 510 of width z. In some embodiments, a PCB holder 440 that creates the generally triangular prism shape of each server blade may be a PCB chassis that contains a front face plate (not shown), a metal side support 450 and a metal backside 460 forming the inclined surface 125 underneath the PCB 420. PCB 420 may be attached to the metal backside 460. The width z of heat sink 510 may be in the range of z<2w to be able to fit within the 2w maximum width of the PCB holder 440 but z may also be greater than width w. Thus, for the generally rectangular server blade of width w, the heat sink may have been a width z w, but the generally triangular server blade allows a larger width heat sink to dissipate more heat from integrated circuits mounted on PCB 420.

Figure 5:
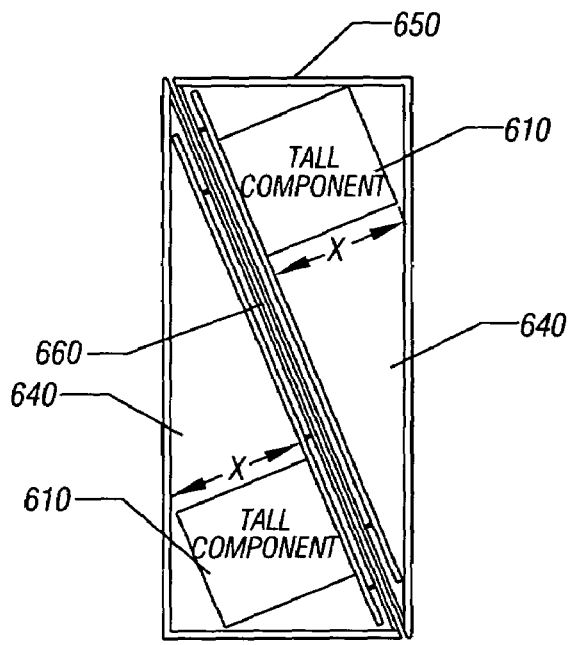
FIG. 5 is a schematic of a cross-sectional view of two server blades each able to fit a tall PCB component in accordance with some embodiments of the present invention.

Turning now to FIG. 5, a cross-sectional view of two server blades shown in FIG. 3 each able to fit a tall PCB component 610 in accordance with some embodiments of the present invention is shown. The tall component 610 in some embodiments may be a hard drive, disk drive, NIC, advanced graphics processor (AGP) controller, or another component that may be mounted on PCB 620 in each of the server blades. A PCB holder 640 that creates the generally triangular prism shape of each server blade may, in some embodiments, be a PCB chassis that contains a front faceplate (not shown), a metal side support 650 and a metal backside 660 forming the inclined surface 125 underneath the PCB 620. PCB 620 is attached to the metal backside 660. The width x may be in the range of x<2w to allow the tall component to fit within the 2w maximum width of the PCB holder 640.

Figure 6:
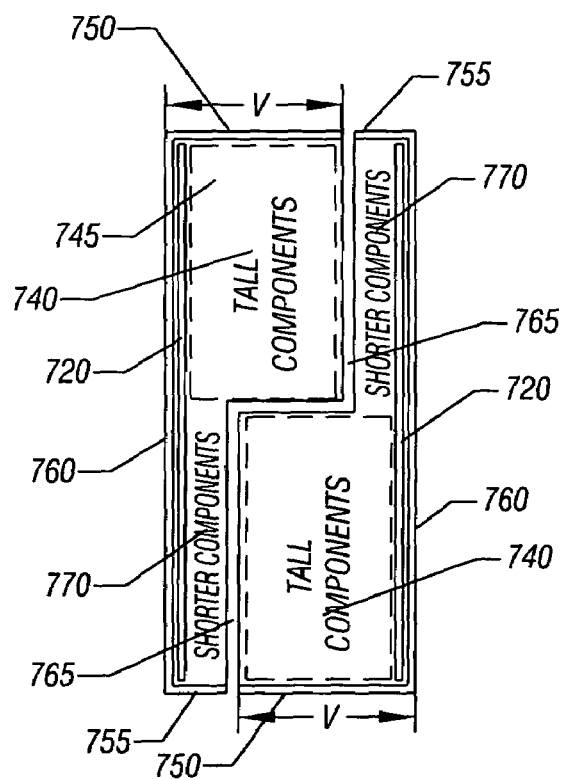
FIG. 6 is a schematic of a cross-sectional view of two server blades in an L-shaped orientation that separates tall components and short components in accordance with another embodiment of the present invention.

Referring now to FIG. 6, in another embodiment, the PCB holder provides a stepped surface having at least a first portion and a second portion, with the two portions of different widths. Larger components can be mounted on the portion with the larger width, while smaller components can be mounted on the portion with the smaller width. Effectively, the cross-sectional profile of the PCB holder according to this embodiment is generally L-shaped. FIG. 6 shows the cross-sectional view of two server blades including PCB holders each with the generally L-shaped profile that separates tall components and short components. Each of the server blades contain a PCB 720 upon which can be mounted in one portion 720 tall electrical components and in another portion 770 shorter electrical components. In some embodiments, the PCB 720 is contained in a PCB holder 745 that may be a PCB chassis and includes a front face plate (not shown), metal side supports 750 and 755 and a metal backside 760 forming a back surface underneath the PCB 720. Each server blade shown in FIG. 6, to allow tall electrical components to fit within PCB holder 745, in some embodiments may have a width of v>w. The server blades would occupy a total space of 2w in the enclosure. Interface side 765 forms a generally L-shape for each server blade that permits each server blade to securely fit together with the other server blade as shown in FIG. 6.

A common characteristic of the PCB holders according to some embodiments is that one portion of the holder has a narrower width than other portion(s) of the holder. As a result, a greater density of components or larger components are mountable on a circuit board attached to the holder.

While the present invention has been described with respect to a limited number of embodiments, those skilled in the art will appreciate numerous modifications and variations therefrom. Thus, the server blade PCB and PCB holder may form any multi-sided polygon that permits tall components placed on the PCB to fit within the dimensions of the polygon. It is intended that the appended claims cover all such modifications and variations as fall within the true spirit and scope of this present invention

What is claimed is:

1. An apparatus, comprising:
   a circuit board holder including at least a first portion and a second portion, wherein the portions are of different widths, the first portion providing a first mounting surface, and the second portion providing a second mounting surface;
   a circuit board contained in the circuit board holder;
   components positioned on the circuit board, wherein said components are positioned to fit within the circuit board holder; and
   an enclosure to receive the circuit board holder, wherein said circuit board holder is generally triangularly shaped in cross-section and includes an inclined surface defining the first and second mounting surfaces,
   wherein the circuit board holder has an inclined wall defining the inclined surface, the inclined wall of the circuit board holder resting against an inclined wall of another circuit board holder in the enclosure.

2. The apparatus of claim 1, wherein each circuit board holder includes a slidable blade.

3. An apparatus, comprising:
   plural circuit board holders each including a circuit board, wherein each circuit board holder has at least a first portion and a second portion, wherein the portions are of different widths; and
   components positioned on each circuit board, wherein said components are positioned to fit within each corresponding circuit board holder,
   wherein each circuit board holder has an inclined surface on which a respective circuit board is mounted,
   wherein each circuit board holder has a generally triangular cross-section.

4. The apparatus of claim 3, wherein the components on each circuit board include a heat sink, a memory socket, a memory module, and a hard disk drive.

5. The apparatus of claim 4, wherein the memory module is mounted at a first angle to a corresponding circuit board.

6. The apparatus of claim 5, wherein the first angle is an acute angle.

7. The apparatus of claim 3, wherein each circuit board holder is a server blade.

8. The apparatus of claim 3, further comprising an enclosure, wherein each circuit board holder slides in and out of the enclosure.

9. A system, comprising:
   an enclosure;
   at least two circuit board holders mounted in the enclosure, wherein each of said circuit board holders is generally polygon shaped in cross section and includes an inclined surface that is the longest side of the polygon; and
   at least two circuit boards held by respective circuit board holders,
   wherein each circuit board is attached to the inclined surface of a respective circuit board holder,
   wherein each circuit board includes components positioned to fit within a respective circuit board holder.

10. The system of claim 9, further comprising a memory module mounted on each circuit board.

11. A system, comprising:
    an enclosure;
    at least two circuit board holders mounted in the enclosure, wherein each of said circuit board holders is generally polygon shaped in cross section and includes an inclined surface that is the longest side of the polygon; and
    at least two circuit boards held by respective circuit board holders,
    wherein said polygon is generally a right triangle.

12. A system, comprising:
    an enclosure;
    at least two circuit board holders coupled to the enclosure, wherein each of said circuit board holders include a stepped profile having at least a first portion and a second portion, wherein the portions are of different widths; and
    at least two circuit boards held by respective circuit board holders,
    wherein each circuit board includes components positioned to fit within a respective circuit board holder, the components mounted in regions provided by the first and second portions of the respective circuit board holder, wherein the region provided by the first portion has a first width to receive one or more components that protrude above a surface of the circuit board by a first amount, and wherein the region provided by the second portion has a second, smaller width to receive one or more components that protrude above the surface of the circuit board by less than the first amount,
    wherein the one or more components that protrude above the surface of the circuit board by the first amount is unable to fit into the region provided by the second portion as a result of the different widths of the first and second portions.

13. The system of claim 12, further comprising a memory module mounted on each circuit board.

14. A method comprising:
    mounting plural circuit boards on respective plural circuit board holders;
    providing each circuit board holder with at least a first portion and a second portion, wherein the portions are of different widths; and
    providing each circuit board holder with a generally triangle shape cross-section with an inclined surface.

15. The method of claim 14, wherein mounting the circuit boards on respective circuit board holders comprises mounting the circuit boards on inclined surfaces of respective circuit board holders.

16. An apparatus, comprising:
    an enclosure;
    plural circuit board holders in the enclosure,
    each circuit board holder including at least a first portion and a second portion, wherein the portions are of different widths, the first portion providing a first region, and the second portion providing a second region; and
    plural circuit boards held by respective circuit board holders,
    wherein each circuit board holder has an inclined wall, wherein the inclined wall of one circuit board holder contacts the inclined wall of another circuit board holder.

17. The apparatus of claim 16, wherein the enclosure has a bay with a generally rectangular cross section,
    wherein an arrangement of two circuit board holders with contacting inclined walls has a generally rectangular cross section that fits within the bay.

18. The apparatus of claim 17, wherein the enclosure has additional bays,
    the apparatus further comprising additional arrangements of circuit board holders, each arrangement having a circuit board holder with an inclined wall contacting an inclined wall of another circuit board holder in the arrangement,
    the additional arrangements of circuit board holders to fit within respective bays of the enclosure.

19. The apparatus of claim 16, further comprising a memory module mounted on each circuit board.

20. An apparatus, comprising:
    plural circuit board holders each including a circuit board, wherein each circuit board holder has at least a first portion and a second portion, wherein the portions are of different widths; and
    components positioned on each circuit board, wherein said components are positioned to fit within each corresponding circuit board holder,
    wherein each circuit board holder has an inclined surface on which a respective circuit board is mounted, wherein each circuit board holder includes an inclined wall defining the inclined surface, wherein the inclined wall of one circuit board holder contacts the inclined wall of another circuit board holder.

21. A system, comprising:
    an enclosure;
    at least two circuit board holders mounted in the enclosure, wherein each of said circuit board holders is generally polygon shaped in cross section and includes an inclined surface that is the longest side of the polygon; and
    at least two circuit boards held by respective circuit board holders,
    wherein each circuit board holder has an inclined wall, the inclined a wall of one circuit board holder contacting the inclined wall of another circuit board holder.

22. The system of claim 21, wherein the inclined wall of each circuit board holder defines the inclined surface on which a respective circuit board is mounted.

23. The system of claim 22, wherein the enclosure includes a bay having a generally rectangular cross section, each circuit board holder having a generally triangular cross section,
    wherein an arrangement of two circuit board holders with contacting inclined walls has a generally rectangular cross section to fit within the bay.

24. The system of claim 23, wherein the enclosure has additional bays,
    the apparatus further comprising additional arrangements of circuit board holders, each arrangement having a circuit board holder with an inclined wall contacting an inclined wall of another circuit board holder in the arrangement,
    the additional arrangements of circuit board holders to fit within respective bays of the enclosure.

\* \* \* \* \*